United States Patent
Bois et al.

(10) Patent No.: US 9,971,864 B2
(45) Date of Patent: May 15, 2018

(54) SYMMETRY VERIFICATIONS FOR DIFFERENTIAL SIGNAL VIAS OF AN ELECTRONIC CIRCUIT DESIGN

(71) Applicant: Hewlett Packard Enterprise Development LP, Houston, TX (US)

(72) Inventors: Karl J. Bois, Fort Collins, CO (US); Elene Chobanyan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 15/217,284

(22) Filed: Jul. 22, 2016

(65) Prior Publication Data
US 2018/0025107 A1    Jan. 25, 2018

(51) Int. Cl.
*G06F 17/50*    (2006.01)

(52) U.S. Cl.
CPC ............... *G06F 17/5081* (2013.01)

(58) Field of Classification Search
CPC .. G06F 17/50; G06F 17/5045; G06F 17/5068; G06F 17/5081; H05K 1/11; H05K 3/42; G01R 31/31706
USPC ......................... 716/106, 110, 122
See application file for complete search history.

(56) References Cited

U.S. PATENT DOCUMENTS

| | | | |
|---|---|---|---|
| 6,883,149 B2 | 4/2005 | Li et al. | |
| 7,571,405 B1 | 8/2009 | Aik | |
| 8,595,667 B1 | 11/2013 | Shroff et al. | |
| 2004/0150970 A1* | 8/2004 | Lee | H05K 1/0251 361/794 |
| 2009/0049419 A1* | 2/2009 | Kato | G06F 17/5054 716/128 |
| 2013/0175077 A1* | 7/2013 | Kim | H05K 1/0222 174/262 |

* cited by examiner

*Primary Examiner* — Paul Dinh
(74) *Attorney, Agent, or Firm* — Hewlett Packard Enterprise Patent Department

(57) ABSTRACT

A system may include an input engine and a symmetry verification engine. The input engine may access an electronic circuit design of an electronic design automation (EDA) tool as well as identify a particular net in the electronic circuit design. The a symmetry verification engine may identify a pair of differential signal vias in the electronic circuit design corresponding to the particular net and determine a verification area surrounding the pair of differential signal vias. The symmetry verification engine may also verify that a particular ground via within the verification area satisfies symmetry criteria with respect to the pair of differential signal vias.

13 Claims, 7 Drawing Sheets ic circuit design.

SYMMETRY VERIFICATIONS FOR DIFFERENTIAL SIGNAL VIAS OF AN ELECTRONIC CIRCUIT DESIGN

BACKGROUND

With rapid advances in technology, computing systems are increasingly prevalent in society today. Vast computing systems execute and support applications that communicate and process immense amounts of data, many times with performance constraints to meet the increasing demands of users. Computing systems include hardware, for example as circuitry implemented through printed circuit boards and integrated circuits. Design of such hardware may include the use of electronic design automation tools.

BRIEF DESCRIPTION OF THE DRAWINGS

Certain examples are described in the following detailed description and in reference to the drawings.

DETAILED DESCRIPTION

The discussion below refers to electronic circuit designs. An electronic circuit design may refer to any electronic representation of an electronic circuit. Electronic design automation (EDA) tools may create, modify, and export electronic circuit designs, which may support the design of physical circuits in a virtual representation prior to actual physical manufacture. Electronic circuit designs may thus include elements of physical electronic circuits, including nets and vias. A net may refer to a connectivity element of the electronic circuit, for example as a conductor or trace that interconnects two or more component terminals of an integrated circuit or a printed circuit board. A via may refer to any electronic connection between layers in the electronic circuit design. Example vias of an electronic circuit design may include signal vias through which nets traverse across different planes, for instance a pair of signal vias for differential signal nets, which may be referred to as a pair of differential signal vias. Other example vias include ground or other reference vias for signal or current return, thermal vias, and more.

Examples consistent with the present disclosure may support symmetry verifications for differential signal vias of an electronic circuit design. Unbalanced circuit elements proximate to differential signal vias may adversely impact the signal integrity of the differential signals. The symmetry verification features disclosed herein may support detection of such unbalanced circuit elements, for example unbalanced ground vias or other reference vias, through application of symmetry criteria. As described in greater detail below, the symmetry criteria may be applied to ground vias located within a verification area surrounding a pair of differential signal vias, and done so to identify unbalanced ground vias that may denigrate signal integrity. Through such detections, the features described herein may support identification of problematic circuit elements or designs that may result in the decreased performance, malfunctioning, or failure of electronic circuits. Moreover, such symmetry verifications may be performed at the design stage prior to manufacture, which may reduce physical defects present in manufactured electronic circuits.

Figure 1:
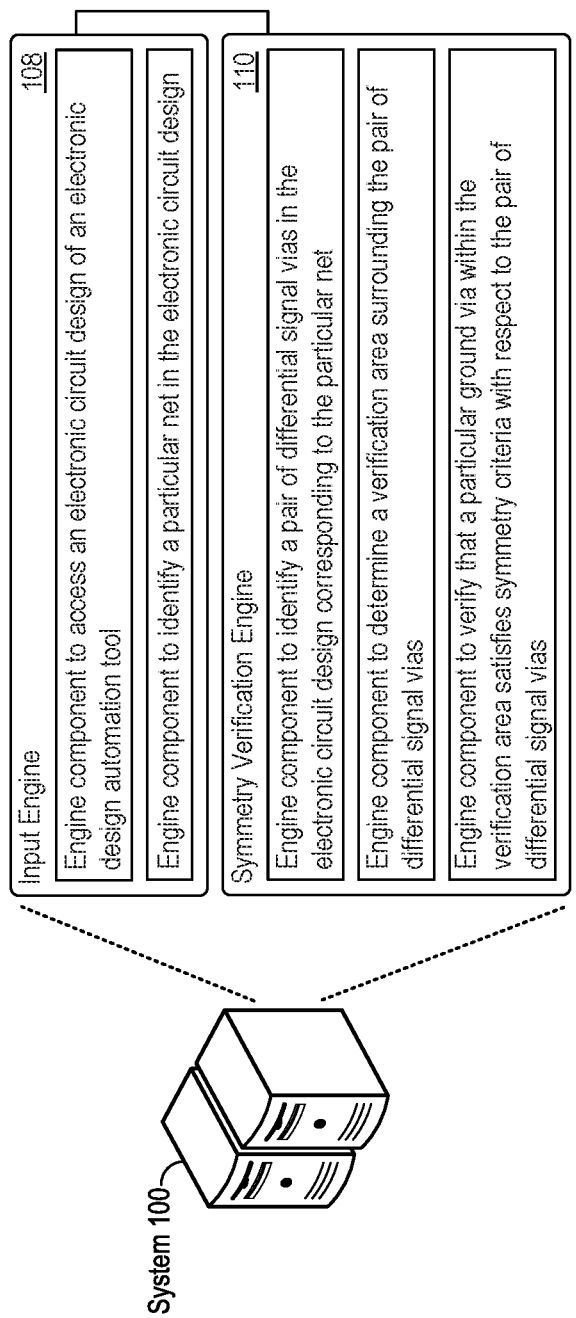
FIG. 1 shows an example of a system that supports symmetry verifications for differential signal vias of an electronic circuit design.

FIG. 1 shows an example of a system 100 that supports symmetry verifications for differential signal vias of an electronic circuit design. The system 100 may take the form of any computing system, and may include a single or multiple computing devices such as servers, compute nodes, desktop or laptop computers, smart phones or other mobile devices, tablet devices, embedded controllers, and more. The system 100 may support execution of various EDA tools to design electronic circuits.

As described in greater detail herein, the system 100 may support symmetry verifications for nets in an electronic circuit design. In particular, the system 100 may perform symmetry verifications for pairs of differential signal vias of the electronic circuit design. Differential signaling used to implement high-speed traces for an electronic circuit may be susceptible to certain circuit characteristics that affect signal integrity. For example, differential signals implemented through a pair of signal traces may be converted to common-mode signals due to unbalanced circuit elements, thus compromising the signal integrity and effectiveness of the differential signals. Such unbalancing may occur due to a number of ground vias proximately located to the differential signal vias that disrupt the impedance, balancing, or other signaling characteristics of the differential signals. To address such concerns, the system 100 may implement any of the various symmetry verification features disclosed herein to detect unbalanced ground vias proximate to differential signal vias. Detection of the unbalanced ground vias may be controlled through configurable symmetry criteria applied to a verification area surrounding a pair of differential signal vias.

The system 100 may implement various engines to provide or support any of the symmetry verification features described herein. In the example shown in FIG. 1, the system 100 implements an input engine 108 and a symmetry verification engine 110. Many of the symmetry verification features disclosed herein are described with respect to the input engine 108 and the symmetry verification engine 110, though various other implementations are possible.

The system 100 may implement the input engine 108 and the symmetry verification engine 110 (including components thereof) in various ways, for example as hardware and programming. The programming for the engines 108 and 110 may take the form of processor-executable instructions stored on a non-transitory machine-readable storage medium, and the processor-executable instructions may, upon execution, cause hardware to perform any of the features described herein. In that regard, various programming instructions of the engines 108 and 110 may implement engine components to support or provide the features described herein.

The hardware for the input engine 108 and the symmetry verification engine 110 may include a processing resource to execute programming instructions. A processing resource may include various number of processors with a single or multiple processing cores, and a processing resource may be implemented through a single-processor or multi-processor architecture. In some examples, the system 100 implements multiple engines using the same system features or hardware components (e.g., a common processing resource).

The input engine 108 and the symmetry verification engine 110 may include components to implement any combination of the features discussed herein. As shown in the example implementation of FIG. 1, the input engine 108 may include engine components to access an electronic circuit design of an EDA tool and identify a particular net in the electronic circuit design. As also shown in the example implementation of FIG. 1, the symmetry verification engine 110 may include engine components to identify a pair of differential signal vias in the electronic circuit design corresponding to the particular net, determine a verification area surrounding the pair of differential signal vias, and verify that a particular ground via within the verification area satisfies symmetry criteria with respect to the pair of differential signal vias.

These and other aspects of the symmetry verification features disclosed herein are described in greater detail next. Much of the description herein with regards to detection of unbalanced circuit elements and application of symmetry criteria are discussed using ground vias as an example circuit element. However, any of the symmetry verification features described herein may be consistently applied or implemented with regards to any other vias for reference signals or any other current return node, such as vias for power reference signals (or any other voltage reference). The symmetry verifcation criteria may thus be applied to determine unbalanced circuit elements of various types.

Figure 2:
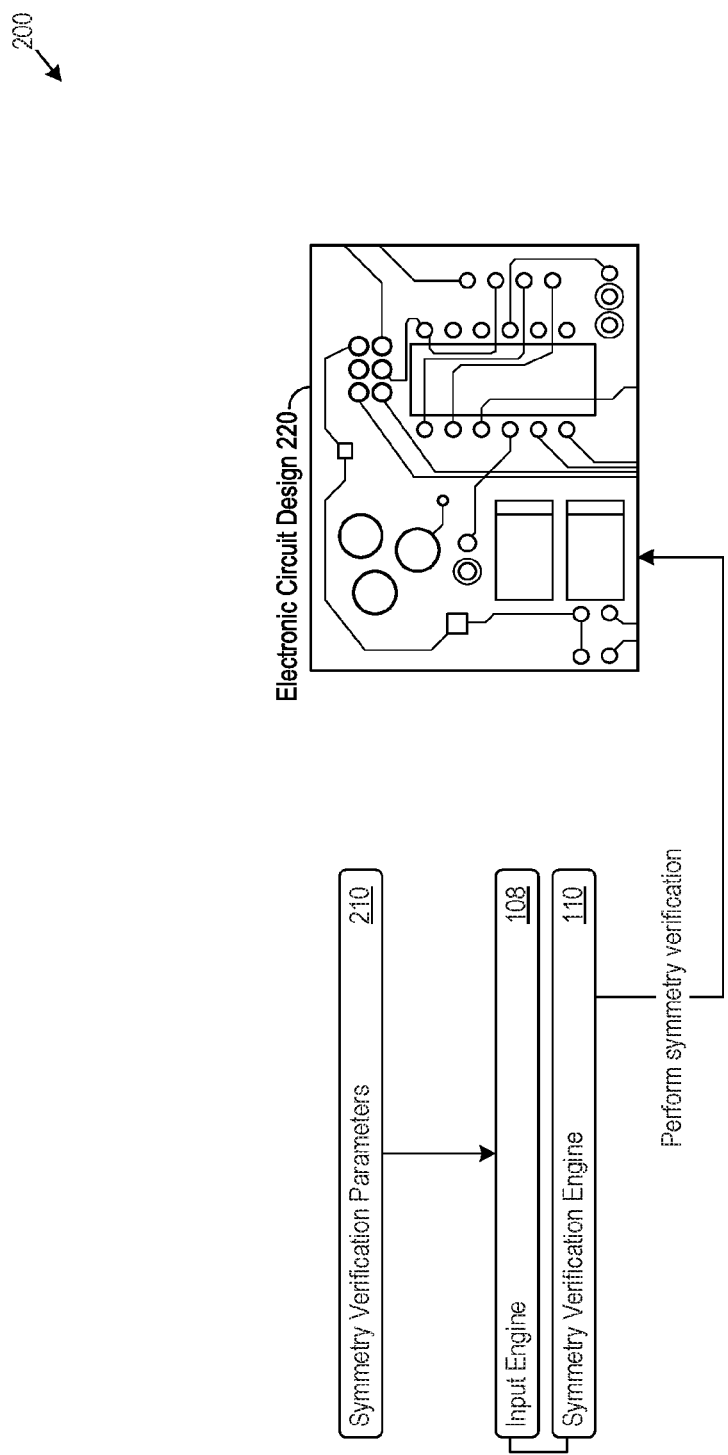
FIG. 2 shows an example of an architecture that may verify whether specified nets of an electronic circuit design satisfy symmetry criteria.

FIG. 2 shows an example of an architecture 200 that may verify whether specified nets of an electronic circuit design satisfy symmetry criteria. The example architecture 200 shown in FIG. 2 includes an input engine 108 and a symmetry verification engine 110, which a computing system may implement. The input engine 108 and symmetry verification engine 110 may function separate from, in combination with, or as part of an EDA tool. In some examples, the programming of the input engine 108 and the symmetry verification engine 110 may include script instructions supported by the EDA tool, and the EDA tool may support, trigger, or provide the symmetry verification features implemented by the input engine 108 and the symmetry verification engine 110.

In operation, the input engine 108 and symmetry verification engine 110 may verify that differential signal vias of an electronic circuit design satisfy symmetry criteria. In doing so, the input engine 108 may access the symmetry verification parameters 210, which may specify any number of parameters applicable to a symmetry verification. Some example symmetry verification parameters that the input engine 108 may access are discussed next.

As an example symmetry verification parameter, the input engine 108 may access or identify a particular electronic circuit design upon which to perform a symmetry verification. In FIG. 2, the symmetry verification parameters 210 identify the electronic circuit design labeled as the electronic circuit design 220. Such an identification may occur through a specified file path wherein a design or board file for the electronic circuit design 220 is located, through a user-specified input identifying the electronic circuit design 220, in a file location co-located with script instructions that form the programming element of the input engine 108, or in any number of other ways to identify the electronic circuit design 220.

As another example symmetry verification parameter, the input engine 108 may access an input list of nets to perform the symmetry verification for. The input list of nets may specify net names, net keywords, or a combination of both to identify specific nets of the electronic circuit design 220. Through an input list, the symmetry verification parameters 210 may provide flexibility in which specific nets of the electronic circuit design 220 to verify satisfaction of symmetry criteria. In some instances, the symmetry verification parameters 210 may specifically identify high-speed or high-performance nets in the electronic circuit design 220 implemented through differential signaling while other nets are omitted, e.g., clock signals, power supply signals, low-speed single-ended data buses, etc. A user or script control logic may thus flexibly select a particular subset of the nets in the electronic circuit design 220 for symmetry verification.

As yet another example symmetry verification parameter, the input engine 108 may access a size parameter that defines a verification area surrounding a pair of differential signal vias. The verification area may be the region surrounding the differential signal vias for which a symmetry verification detects unbalanced circuit elements. In some examples, the size parameter takes the form of a verification radial parameter, through which a verification area may be determined as a circular area surrounding pairs of differential signal vias with a radius equal to the value of the verification radial parameter. In other examples, the verification area surrounding differential signal vias may take the form of other polygons or shapes, such as an elliptical verification area, a rectangular verification area, a square verification area, or non-regular shapes. The size parameter may thus specify dimensions (e.g., length or width) or other characteristics (e.g., an area size, perimeter features, or shape identifier) that define a verification area surrounding pairs of differential signal vias of the electronic circuit design 220.

In some examples, the symmetry verification parameters 210 includes a tolerance threshold parameter. The tolerance threshold parameter may specify a deviance from strict symmetry within the verification area that is allowed by the symmetry criteria. To illustrate, a strict symmetry requirement of symmetry criteria may require that a particular circuit element (e.g., ground via) be located in a particular position within a verification area, e.g., with respect to the pair of differential signal vias or with respect to a different ground via also located within the verification area. Strict symmetry may define a pinpoint location at which a ground via or other circuit element is balanced within the verification area. The tolerance parameter may specify a threshold distance from the pinpoint location in which the ground via may nonetheless satisfy the symmetry criteria (e.g., without meeting the strict symmetry requirement).

The input engine 108 may access any combination of the example symmetry verification parameters described above. In some examples, the symmetry verification parameters 210 are specified through a user-provided input file, as user inputs provided through a user interface (e.g., command line or script-prompted interface), as code parameters, or in various other ways. As such, the symmetry verification parameters 210 may be set forth, in part or in whole, through an input file. In such examples, the input engine 108 may identify nets for symmetry verification based on net names, net keywords, or both, specified in a user-provided input file.

In other implementations, a user may configure any number of symmetry verification parameters 210 through a command line or script interface, through a graphical user interface, through interfaces provided by an EDA tool itself, or in other ways.

Turning to the symmetry verification itself, the symmetry verification engine 110 may perform the symmetry verification according to the symmetry verification parameters 210. In doing so, the symmetry verification may identify pairs of differential signal vias for specified nets, determine a verification area surrounding the pairs of differential vias, and verify that ground vias located within the verification area satisfy symmetry criteria. As the electronic circuit design 220 may include multiple via pairs for a particular differential signal, the symmetry verification engine 110 may identify multiple (e.g., each) pair of differential signal vias of a particular net or differential signal. The symmetry verification engine 110 may perform the symmetry verification for each of the identified pairs of signal vias to verify the particular net and consistently do so for each of the specified nets.

The symmetry verification engine 110 may determine whether ground vias within a verification area satisfy symmetry criteria based on the positions of the ground vias within the verification area. Positioning of circuit elements within an electronic circuit design may be specified through a coordinate system. For example, an EDA tool may use a global coordinate system in which circuit elements of an electronic circuit design (e.g., of a particular circuit layer) are assigned global coordinate values (e.g., an x-value and a y-value in a particular circuit layer). In some examples, the symmetry verification engine 110 evaluates symmetry criteria for ground vias in a verification area based on the global coordinates of the ground vias. Additionally or alternatively, the symmetry verification engine 110 may realign a verification area into a local coordinate system as part of the symmetry verification. Such a realignment may be performed by transforming global coordinates of an EDA tool into local coordinates specific to the verification area. The symmetry verification engine 110 may thus realign a verification area prior to application of the symmetry criteria, and an example realignment is presented next through FIG. 3.

Figure 3:
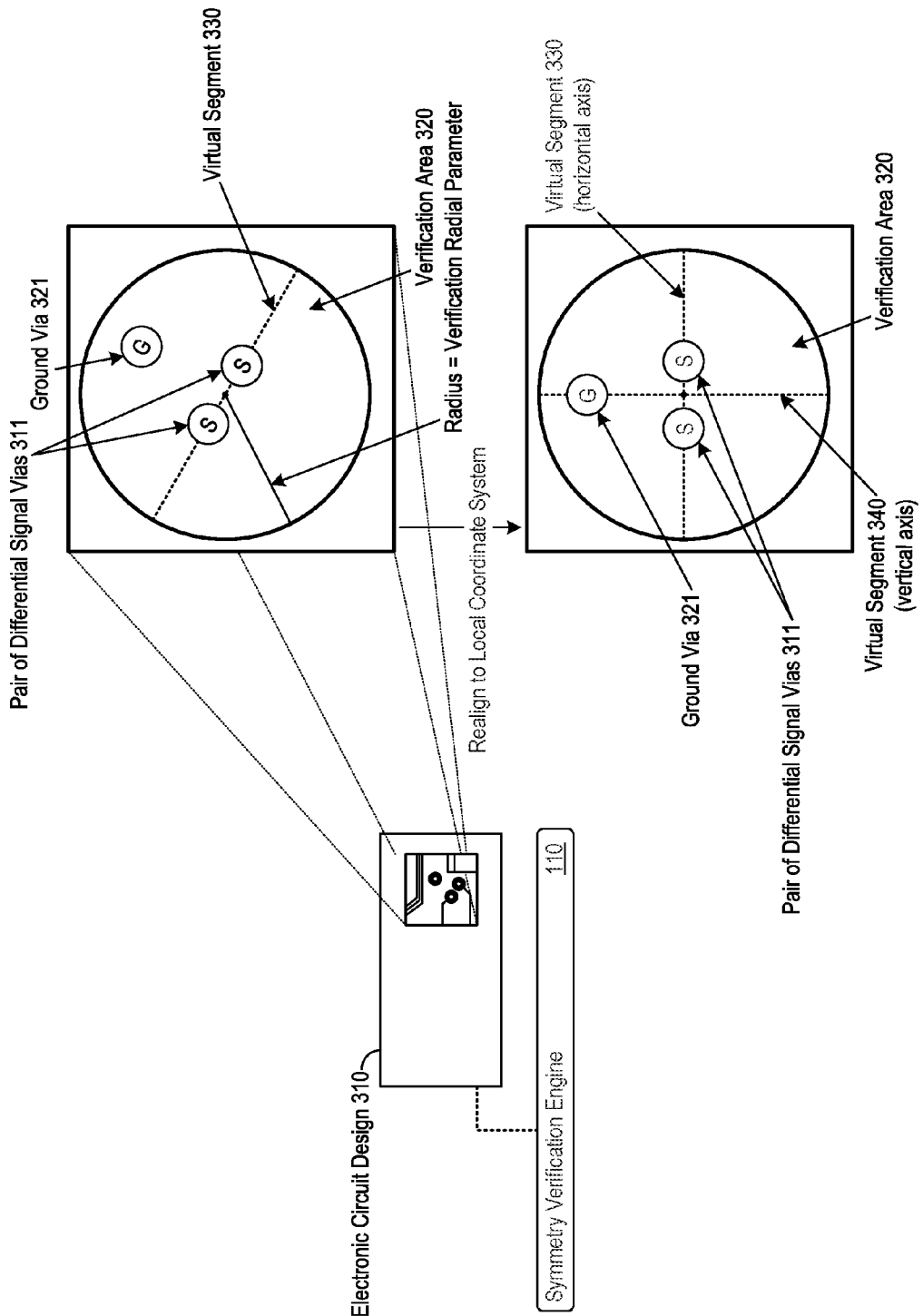
FIG. 3 shows an example of a verification area realignment that a symmetry verification engine may apply.

FIG. 3 shows an example of a verification area realignment that a symmetry verification engine 110 may apply. In FIG. 3, the symmetry verification engine 110 may perform a symmetry verification for the electronic circuit design 310. As part of the symmetry verification, the symmetry verification engine 110 may identify the pair of differential signal vias 311 and determine a verification area surrounding the pair of differential signal vias 311.

In the example shown in FIG. 3, the symmetry verification engine 110 determines the verification area as a circular area that surrounds the pair of differential signal vias 311 with a center point equal to a midpoint between the pair of differential signal vias 311 and a radius equal to a verification radial parameter (e.g., accessed as a user-specified symmetry verification parameter). An example verification area that the symmetry verification engine 110 may determine for the pair of differential signal vias 311 is shown in FIG. 3 as the verification area 320. Within the verification area 320, the symmetry verification engine 110 may identify ground vias for symmetry verification, such as the ground via 321 included in FIG. 3.

The symmetry verification engine 110 may realign the verification area 320 into a local coordinate system. In some implementations, the symmetry verification engine 110 realigns the verification area 320 such that the pair of differential signal vias 311 are positioned along a horizontal axis upon realignment. Put another way, the symmetry verification engine 110 may transform global coordinates for the verification area 320 into local coordinates such that the pair of differential signal vias 311 are located on the horizontal axis (e.g., x-axis) of the local coordinate system. Through realignment, the midpoint between the pair of differential signal vias 311 may form the center of the verification area 320. To do so, the symmetry verification engine 110 may realign the verification area 320 by transforming the global coordinates of the midpoint to the center of the local coordinate system, e.g., the (0,0) coordinate of the local coordinate system. The symmetry verification engine 110 may also rotate the verification area 320 such that the coordinates of each differential signal via is located on the horizontal axis passing through the center of the verification area 320. Upon realignment, the pair of differential signal vias 311 may thus be positioned in the local coordinate system along the horizontal x-axis of the verification area 320.

To illustrate through FIG. 3, a virtual segment 330 is shown passing through the pair of differential signal vias 311 (and thus through the center of the pair of differential signal vias 311). Prior to realignment (e.g., in global coordinates used by an EDA tool), the pair of differential signal vias 311 and the virtual segment 330 are not positioned along a horizontal axis of the verification area 320. To realign the verification area 320, the symmetry verification engine 110 may transform the global coordinates of the circuit elements within the verification area 320 so the pair of differential signal vias 311 are rotated onto the x-axis of the verification area. After realignment, the virtual segment 330 passing through the pair of differential signal vias 311 is positioned along the horizontal axis of the verification area 320. Also shown in FIG. 3 (after realignment) is a virtual segment 340 that forms the vertical axis of the verification area 320. The symmetry verification engine 110 may similarly realign each circuit element in the verification area 320, such as the ground via 321 which is positioned on the vertical axis of the verification area 320 after realignment.

The symmetry verification engine 110 may thus realign the verification area 320 to a local coordinate system for the verification area 320 such that the pair of differential signal vias 311 are positioned along a horizontal axis of the local coordinate system (e.g., as shown through the virtual segment 330) and a midpoint between the pair of differential signal vias 311 is a center of the local coordinate system. After realignment, the symmetry verification engine 110 may verify that a particular ground via (e.g., the ground via 321) satisfies symmetry criteria based on a position of the particular ground via in the local coordinate system, a position of a different ground via in the local coordinate system, or a combination of both.

One example of verification area realignment is shown through FIG. 3. The symmetry verification engine 110 may perform such a realignment for some or all of the determined verification areas for differential signal vias included in a symmetry verification process. The symmetry verification engine 110 may perform the verification area realignment to facilitate application of symmetry criteria, for instance to reduce the complexity of positional verifications in determining that ground vias in the verification area satisfy the symmetry criteria. In some implementations though, the symmetry verification engine 110 does not apply any verification area realignments, instead applying the symmetry criteria using global coordinates of an EDA tool and without rotation of the verification area to align the pair of differential signal vias onto a horizontal axis. With or without realignment, the symmetry verification engine 110 may apply symmetry criteria to each of the ground vias identified in a verification area for a pair of differential signal vias.

Figure 4:
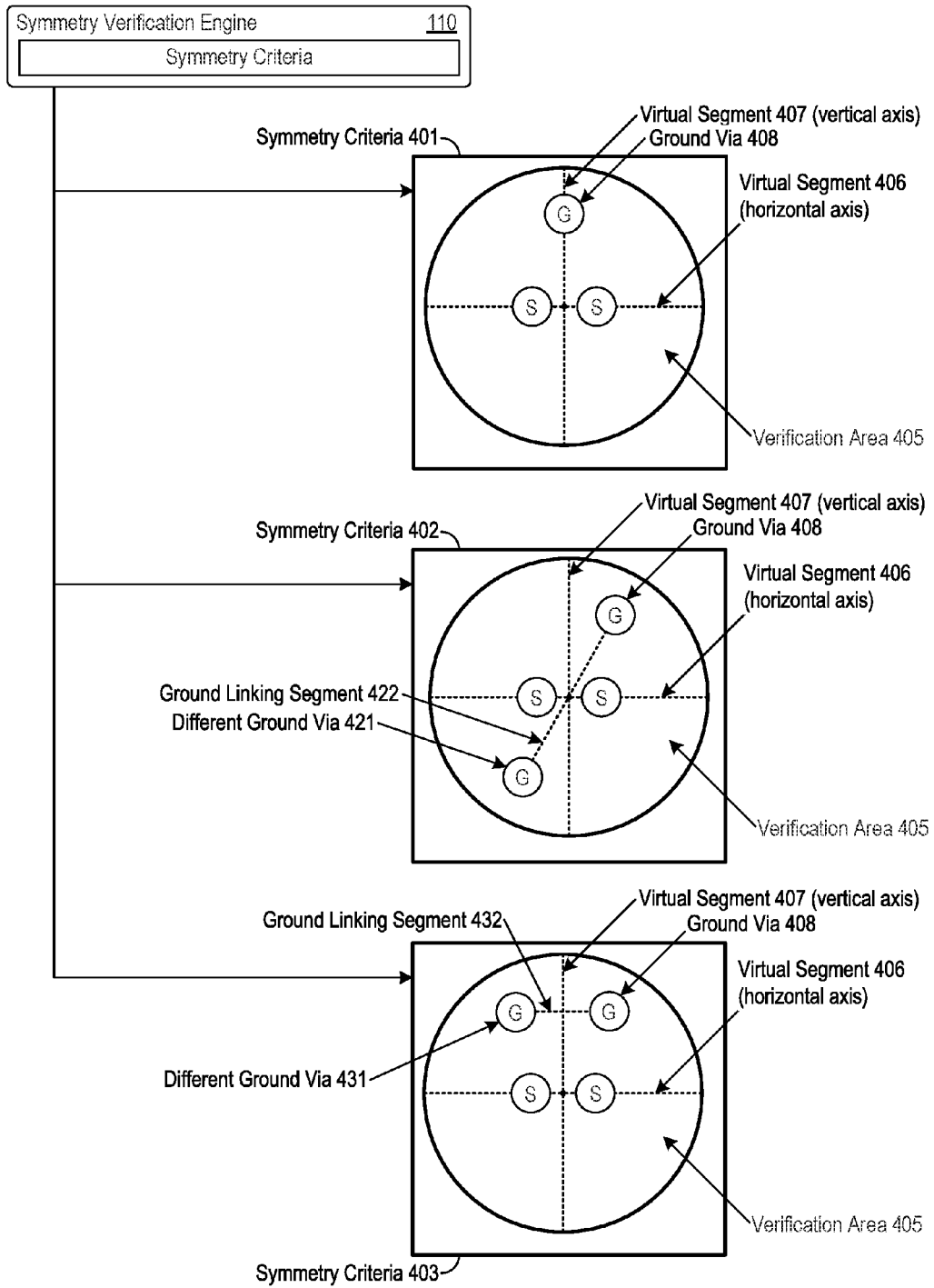
FIG. 4 shows example symmetry criteria that a symmetry verification engine may apply.

FIG. 4 shows example symmetry criteria that the symmetry verification engine 110 may apply. The symmetry criteria shown in FIG. 4 include the symmetry criteria 401, 402, and 403, and the symmetry verification engine 110 may determine a particular ground via located in a verification area satisfies the symmetry criteria when at least one of the symmetry criteria 401, 402, and 403 are satisfied. On the other hand, the symmetry verification engine 110 may determine that a particular ground via does not satisfy the symmetry criteria when the particular ground via fails to satisfy any of the symmetry criteria 401, 402, and 403.

In FIG. 4, the symmetry criteria 401, 402, and 403 are depicted and described after the symmetry verification engine 110 realigns a verification area to a local coordinate system (or, as another scenario, when a pair of differential signal vias are positioned along the same horizontal line in the global coordinate system, e.g., have the same vertical coordinate value in the global coordinate system of an EDA tool).

Each of the symmetry criteria 401, 402, and 403 are illustrated through a verification area 405 that includes a pair of differential signal vias labeled with an "S". The verification area 405 further includes a virtual segment 406 passing through the pair of differential signal vias, shown in the examples of FIG. 4 as the horizontal axis of the verification area 405 after realignment. The verification area 405 further includes a virtual segment 407 which passes through the midpoint of the pair of differential signal vias and is perpendicular to the virtual segment 406. In the examples of FIG. 4, the virtual segment 407 is shown as the vertical axis of the verification area 405. For the particular illustrations shown in FIG. 4, the virtual segment 406 is realigned specifically as the horizontal axis of the verification area 405 and the virtual segment 407 is realigned as the vertical axis. However, the symmetry criteria 401, 402, and 403 may be consistently applied with respect to the virtual segments 406 and 407 without verification area realignment as well.

Examples of each of the symmetry criteria 401, 402, and 403 shown FIG. 4 are applied to an example ground via located within the verification area 405, shown as the ground via 408. In particular, FIG. 4 illustrates example positions for the ground via 408 and a different ground via (when applicable) in which the symmetry verification engine 110 determines the ground via 408 satisfies the symmetry criteria 401, 402, and 403 respectively. Each of these symmetry criteria are described in greater detail next.

With respect to the symmetry criteria 401, the symmetry verification engine 110 may determine a ground via 408 satisfies the symmetry criteria 401 when the ground via 408 is located at a position equidistant from each differential signal via of a pair of differential signal vias. In that regard, the ground via 408 itself may be balanced within the verification area 405 because any effect on the impedance or signal characteristics by the ground via 408 is not disproportionately applied to one of differential signal vias more than the other. Thus, the signal integrity of a differential signal may be not be adversely impacted by a lone ground via located equidistant from each of the two differential signal vias. To verify the symmetry criteria 401, the symmetry verification engine 110 may identify any ground via position on the virtual segment 407 as satisfying the symmetry criteria 401. The symmetry verification engine 110 may thus verify that a particular ground via satisfies the symmetry criteria 401 without reference to the position of any other ground via in the verification area 405.

For a verification area 405 realigned into the local coordinate system, the symmetry verification engine 110 may determine that any ground via located along the vertical axis of the verification area as satisfying the symmetry criteria 401. That is, the symmetry verification engine 110 may verify the symmetry criteria 401 are satisfied when a particular ground via is positioned on a vertical axis (e.g., the virtual segment 407) of the local coordinate system that intersects the horizontal axis (e.g., the virtual segment 406) at the midpoint between the pair of differential signal vias. Expressed in yet another way, the symmetry verification engine 110 may determine that any ground via with a horizontal coordinate value (e.g., x-value) of 0 as satisfying the symmetry criteria 401. As noted above, the symmetry verification engine 110 may apply a tolerance threshold parameter. In such examples, the symmetry verification engine 110 may determine ground vias positioned within a threshold distance from the virtual segment 407 (e.g., the vertical axis of the verification area 405) likewise satisfy the symmetry criteria 401.

Turning to the symmetry criteria 402 and 403, the symmetry verification engine 110 may verify the ground via 408 by referencing the position of a different ground via in the verification area 405. In particular, the symmetry verification engine 110 may determine that the symmetry criteria are satisfied when a different ground via in the verification area 405 counterbalances the ground via 408.

In a general sense, the symmetry criteria 402 may be satisfied when a different ground via is located at a position inflected across both the virtual segment 406 and the virtual segment 407 from the ground via 408. Such a scenario is illustrated in FIG. 4 with respect to the symmetry criteria 402 through the different ground via 421. Within the local coordinate system in which the virtual segments 406 are positioned as horizontal and vertical axes respectively, the different ground via 421 may have a vertical coordinate value that is the inverse of the vertical coordinate value of the ground via 408 (and may thus be inflected across the horizontal axis). The different ground via 421 may also have a horizontal coordinate value that is the inverse of the horizontal coordinate value of the ground via 408 (and may thus be inflected across the vertical axis as well). As such, the symmetry verification engine 110 may determine a particular ground via satisfies the symmetry criteria 402 when the verification area 405 includes a different ground via having a horizontal coordinate value that is the inverse of a horizontal coordinate value of the particular ground via (or within a threshold distance specified by a tolerance threshold parameter) and having a vertical coordinate value that is the inverse of a vertical coordinate value of the particular ground via (or within a threshold distance specified by a tolerance threshold parameter).

As another symmetry verification mechanism, the symmetry verification engine 110 may determine the symmetry criteria 402 are satisfied when a ground linking segment between the ground via 408 and the different ground via 421 passes through the center of the verification area 405 and intersects the center at the midpoint of the ground linking segment. To illustrate through FIG. 4, a ground linking segment 422 is depicted connecting the ground via 408 to the different ground via 421. The symmetry verification engine 110 may determine the ground via 408 (as well as the different ground via 421) satisfy the symmetry criteria 402 when (i) the ground linking segment 422 passes through the center of the verification area 405 (e.g., the (0,0) coordinate of the local coordinate system); and (ii) the ground linking segment 422 intersects the center of the local coordinate system at the midpoint of ground linking segment 422, which may indicate that the ground via 408 and the different ground via 421 are equidistant from the center of the verification area 405. The symmetry verification engine 110 may apply any number of tolerance thresholds in these example symmetry verification mechanisms as well.

In any of the ways described above, the symmetry verification engine 110 may verify that a particular ground via satisfies the symmetry criteria 402. The description above may specify how the symmetry verification engine 110 verifies a strict symmetry requirement of the symmetry criteria 402. As mentioned herein, the symmetry verification engine 110 may apply a tolerance threshold as well, for example a tolerated deviation in location or positioning for the different ground via 421 or the ground linking segment 422 by which the symmetry verification engine 110 may nonetheless verify that ground via 408 satisfies the symmetry criteria 402.

Turning next to the symmetry criteria 403, the symmetry verification engine 110 may determine the ground via 408 satisfies the symmetry criteria 403 in various ways. In a general sense, the symmetry criteria 403 may be satisfied when a different ground via is located at a position inflected across the virtual segment 407 from the ground via 408. FIG. 4 illustrates such a scenario for the symmetry criteria 403 through the different ground via 431.

Within the local coordinate system in which the virtual segment 407 is positioned as a vertical axis of the verification area 405, the different ground via 421 may have a vertical coordinate value that is equal to the vertical coordinate value of the ground via 408 and a horizontal coordinate value that is the inverse of the horizontal coordinate value of the ground via 408 (and thus inflected across the vertical axis). As such, the symmetry verification engine 110 may determine a particular ground via satisfies the symmetry criteria 403 when the verification area 405 includes a different ground via having a horizontal coordinate value that is equal to the horizontal coordinate value of the particular ground via (or within a threshold distance specified by a tolerance threshold parameter) and having a vertical coordinate value that is the inverse of a vertical coordinate value of the particular ground via (or within a threshold distance specified by a tolerance threshold parameter).

As another mechanism to verify symmetry, the symmetry verification engine 110 may determine the symmetry criteria 403 are satisfied when a ground linking segment connecting the ground via 408 and the different ground via 431 is perpendicular to the virtual segment 407 and intersects the virtual segment 407 at the midpoint of the ground linking segment. To illustrate through FIG. 4, a ground linking segment 432 is depicted connecting the ground via 408 to the different ground via 431. The symmetry verification engine 110 may determine the ground via 408 (as well as the different ground via 421) satisfy the symmetry criteria 403 when (i) the ground linking segment 432 is perpendicular to the virtual segment 407 (and thus parallel to the virtual segment 406); and (ii) the ground linking segment 432 intersects the virtual segment 307 at the midpoint of ground linking segment 422. As with the symmetry criteria 401 and 402, the symmetry verification engine 110 may apply a tolerance threshold in verifying the symmetry criteria 403.

Through the symmetry criteria 401, 402, and 403, the symmetry verification engine 110 may verify that each ground via located within a verification area satisfies symmetry criteria. In that regard, the symmetry verification engine 110 may verify that each ground via is either (i) balanced through being positioned equidistant from each of the differential signal vias and satisfying the symmetry criteria 401 or (ii) has a counterbalancing ground via located at a position within the verification area that satisfies the symmetry criteria 402 or 403.

The symmetry verification engine 110 may perform symmetry verifications through a local coordinate system or through global coordinates used by an EDA tool. When a ground via located within the verification area fails to satisfy any of the symmetry criteria 401, 402, and 403, the symmetry verification engine 110 may determine the electronic circuit design includes at least one unbalanced ground via and report such a determination. For instance, the symmetry verification engine 110 may output each verification area or pair of differential signal vias determined to be in an unbalanced state with at least one unbalanced ground via that fails symmetry criteria. Identification of such scenarios during the design phase may allow for design adjustments to address the unbalancing, and ultimately improve circuit performance. As such, the symmetry verification features disclosed herein may improve design efficiency and circuit performance.

Figure 5:
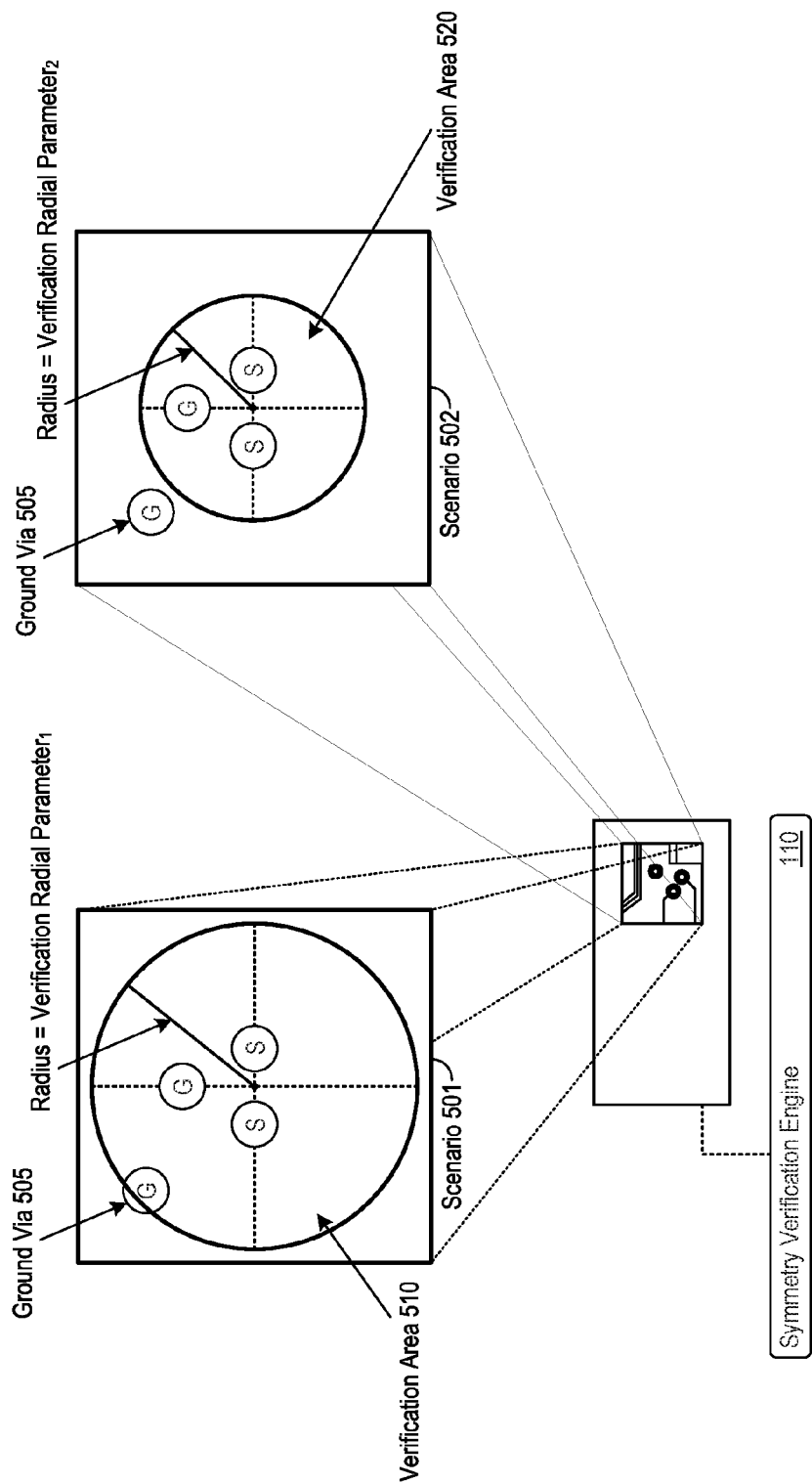
FIG. 5 shows example scenarios in which a symmetry verification engine may apply symmetry criteria.

FIG. 5 shows example scenarios in which the symmetry verification engine 110 may apply symmetry criteria. In particular, FIG. 5 shows how determination of the verification area by the symmetry verification engine 110 may affect whether the symmetry criteria are satisfied or not. Another factor affecting whether the symmetry criteria are satisfied or not is how the symmetry verification engine 110 determines whether a ground via is located within the verification area or not. FIG. 5 illustrates the impact of these factors upon the symmetry verification through the scenarios 501 and 502.

The scenarios 501 and 502 shown in FIG. 5 each include a pair of differential signal vias labeled as "S" and a ground via located equidistant from each of the differential signal vias. The scenarios 501 and 502 each further include a ground via labeled as the ground via 505, and the determination of the verification area surrounding the pair of differential signal vias may impact whether the symmetry criteria are satisfied or not. The difference in the scenarios 501 and 502 is the verification radial parameter used by the symmetry verification engine 110 to determine a verification area.

In the scenario 501, the symmetry verification engine 110 determines the verification area 510 with a radius equal to the value of verification radial parameter$_1$. The value of a verification radial parameter impacts the size of a determined verification area. The greater the value of the verification radial parameter, the greater the determined verification area may be. In a consistent manner for verification areas of other shapes and dimension, any symmetry verification parameter that impacts the size of a determined verification area may impact whether the symmetry criteria are satisfied or not. This may be the case as the larger the determined verification area, the greater the number of ground vias that the symmetry verification engine 110 may identify as being located within the verification area. The smaller the verification area, the lesser the number of ground vias the symmetry verification engine 110 may identify.

In the scenario 501 of FIG. 5, the symmetry verification engine 110 determines the verification area 510 from verification radial parameters such that a portion of the ground via 505 is encompassed within the verification area 510.

How the symmetry verification engine 110 determines whether a ground via is located within a verification area or not impacts satisfaction of the symmetry criteria. For instance, when the symmetry verification engine 110 determines that the ground via 505 is located within the verification area 510, the symmetry criteria may fail as the ground via 505 may fail to satisfy any of the symmetry criteria 401, 402 and 403. Were the symmetry verification engine 110 to determine that the ground via 505 is not located within the verification area 510 (e.g., because at least a portion of the ground via 505 is located outside of the verification area), then the symmetry verification engine 110 may determine that each ground via in the verification area 510 satisfy the symmetry criteria. In this case, the symmetry verification engine 110 may determine that the sole ground via in the verification area 510 that is positioned on the vertical axis of the verification area 510 satisfies the symmetry criteria 401.

In some examples, the symmetry verification engine 110 determines a particular ground via is positioned within a verification area when a center of the particular ground via is within the verification area. Applied to the scenario 501, the symmetry verification engine 110 may determine that the ground via 505 is located within the verification area 510 and further determine that the ground via 505 as an unbalanced circuit element that fails the symmetry criteria As other examples, the symmetry verification engine 110 may determine a particular ground via is positioned within a verification area when more than a threshold portion of the ground via (e.g., >50%) is encompassed within the verification area, when all of the ground via is located within the verification area, when any portion of the ground via is located within the verification area, or in other ways.

Turning to the scenario 502, the symmetry verification engine 110 may instead determine the verification area 520 with a radius equal to the value of verification radial parameter$_2$. The verification area 520 is smaller than the verification area 510, and consequently no portion of the ground via 505 is located within the verification area 520. The symmetry verification engine 110 may not apply any symmetry criteria to the ground via 505, as the ground via 505 is not positioned within the verification area 520. The symmetry verification engine 110 may also determine that the only ground via located within the verification area 520 satisfies the symmetry criteria. Thus, the symmetry verification engine 110 may determine that the scenario 502 does not violate symmetry criteria whereas the scenario 501 does.

The scenarios 501 and 502 provide one example of how the size of a verification area determined by the symmetry verification engine 110 may affect whether symmetry criteria are satisfied or not. In some implementations, the verification radial parameter (or any other size parameter defining or otherwise affecting determination of a verification area) is configured to satisfy performance goals for an electronic circuit. Performance goals may require a threshold level performance, which may be specified through an acceptable signal integrity deviations for a particular electronic circuit. Based on such metrics or parameters, the symmetry verification engine 110 may apply a particular radial verification parameter or other size parameter accordingly. The more stringent the performance requirement, the larger the verification area the symmetry verification engine 110 may determine to ensure a balanced area surrounding differential signal vias, and vice versa.

Figure 6:
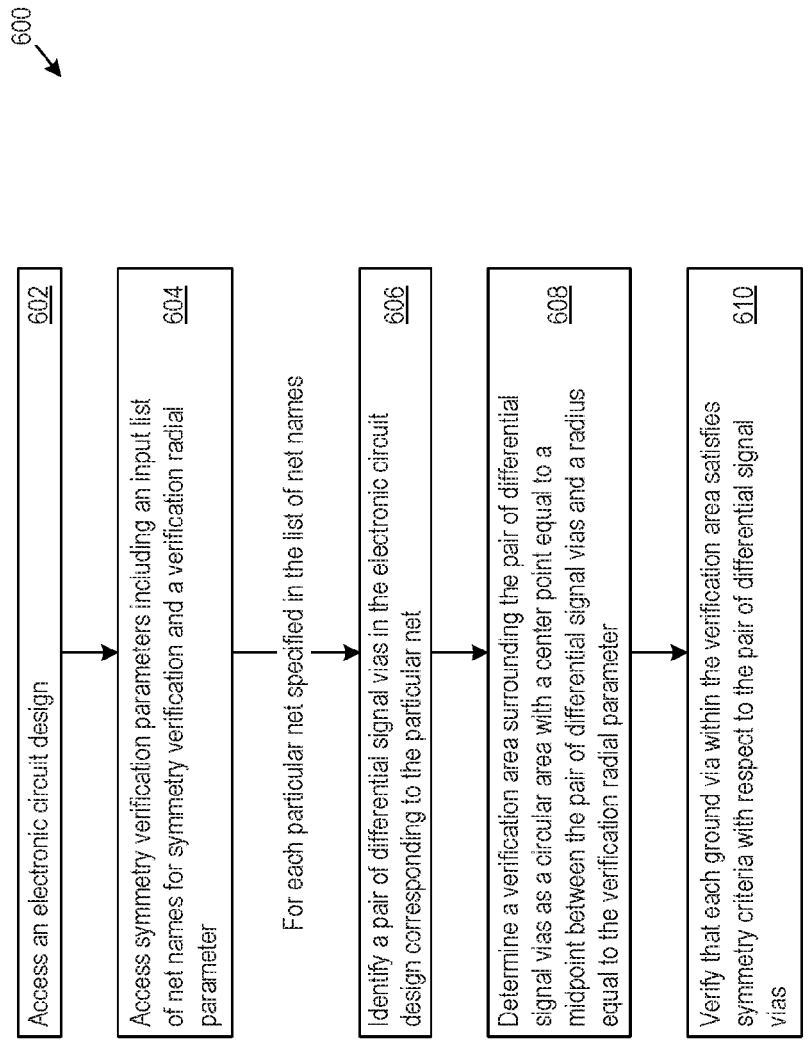
FIG. 6 shows flow chart of an example method for symmetry verifications for differential signal vias of an electronic circuit design.

FIG. 6 shows a flow chart of an example method 600 for symmetry verifications for differential signal vias of an electronic circuit design. Implementation and execution of the method 600 is described with reference to the input engine 108 and the symmetry verification engine 110. However, any other device, hardware-programming combination, or other suitable computing system may execute any of the steps of the method 600. As examples, the method 600 may be implemented in the form of executable instructions stored on a machine-readable storage medium or in the form of electronic circuitry.

In implementing or performing the method 600, the input engine 108 may access an electronic circuit design of an EDA tool (602) as well as symmetry verification parameters that include an input list of net names for symmetry verification and a verification radial parameter (604). The input engine 108 may access the symmetry verification parameters as, for example, a user-provided input file, as user inputs provided through a user interface (e.g., command line or script-prompted interface), as code parameters, or in various other ways.

In implementing or performing the method 600, the symmetry verification engine 110 may perform a symmetry verification for each particular net specified in the input list of net names. In doing so, the symmetry verification engine 110 may identifying a pair of differential signal vias in the electronic circuit design corresponding to a particular net (606). The symmetry verification engine 110 may also determine a verification area surrounding the pair of differential signal vias as a circular area with a center point equal to a midpoint between the pair of differential signal vias and a radius equal to the verification radial parameter (608). In other examples, the symmetry verification engine 110 may determine the verification area as an elliptical area, a rectangular area, a square area, a non-regular shaped area, or according to any other area-defining characteristics. Upon determination of the verification area, the symmetry verification engine 110 may verify that each ground via within the verification area satisfies symmetry criteria with respect to the pair of differential signal vias (610).

In verifying the symmetry criteria, the symmetry verification engine 110 may apply any combination of the symmetry criteria discussed herein, including the symmetry criteria 401, 402, and 403 discussed with respect to FIG. 4. In some examples, the symmetry verification engine 110 may verify the particular ground via satisfies the symmetry criteria by identifying a first axis in the verification area that passes through the pair of differential signal vias, identifying a second axis in the verification area that is perpendicular to the first axis and that intersects the first axis at a midpoint between the pair of differential signal vias; and determining the particular ground via satisfies the symmetry criteria when the particular ground via is positioned with a threshold distance from the second axis. In some examples, the symmetry verification engine 110 may verify that the particular ground via satisfies the symmetry criteria further by identifying a ground linking segment that passes through the particular ground via and a different ground via in the verification area and determining the particular ground via satisfies the symmetry criteria when (i) the ground linking segment intersects the first axis within the threshold distance from a midpoint between the pair of differential signal vias; (ii) the ground linking segment is perpendicular to the second axis; and (iii) a midpoint of the ground linking segment is within the threshold distance from the midpoint between the pair of differential signals. In these examples, the threshold distance may be identified by the input engine 108 or symmetry verification engine 110 as a user-specified tolerance threshold value.

Regarding determination of ground vias located within a verification area, the symmetry verification engine 110 may identify a particular ground via in the electronic circuit design is within the verification area of a pair of differential signal vias when a center of the particular ground via is located within the verification area. Conversely, the symmetry verification engine 110 may identify a particular ground via in the electronic circuit design is not within the verification area of a pair of differential signal vias when a center of the particular ground via is not located within the verification area. Other criteria for determining whether a particular ground via is located within a verification area (and thus subject to symmetry criteria) are possible, including any described above.

In some implementations, the symmetry verification engine 110 realigns a determined verification area prior to application of symmetry criteria. Such a realignment may include transformation of global coordinates applied by an EDA tool into a local coordinate system for the verification area. Such a realignment may also include rotating of the verification area, including circuit elements in the verification area, to facilitate application of symmetry criteria. For instance, the symmetry verification engine 110 may realign the verification area to a local coordinate system for the verification area such that the pair of differential signal vias are positioned along a horizontal axis of the local coordinate system and a midpoint between the pair of signal vias is a center of the local coordinate system and verify that a particular ground via in the verification area satisfies the symmetry criteria based on a location of the particular ground via in the local coordinate system, a position of a different ground via in the local coordinate system, or a combination of both.

Although one example was shown in FIG. 6, the steps of the method 600 may be ordered in various ways. Likewise, the method 600 may include any number of additional or alternative steps, including steps implementing any feature described herein with respect to the input engine 108, the symmetry verification engine 110, or a combination thereof.

Figure 7:
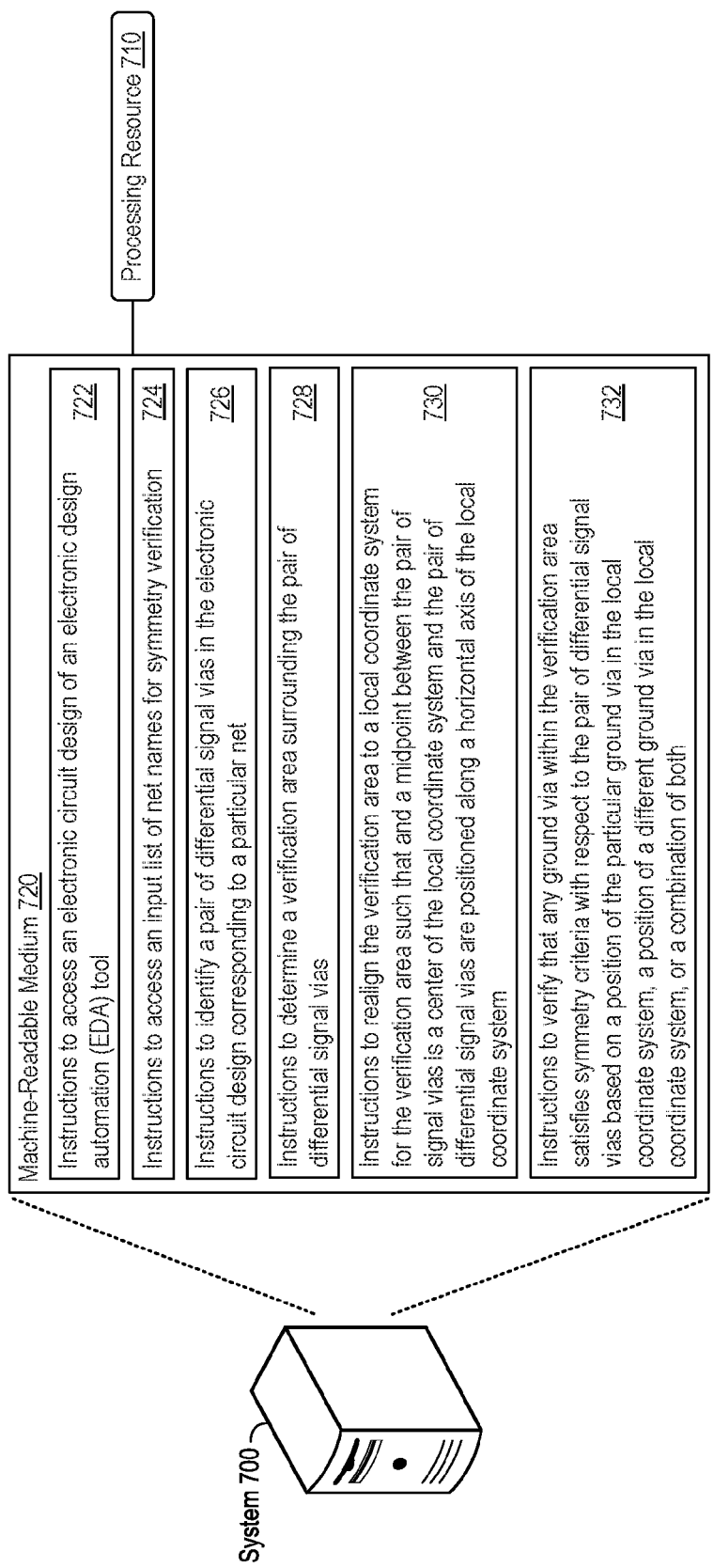
FIG. 7 shows an example of a system that supports symmetry verifications for differential signal vias of an electronic circuit design.

FIG. 7 shows an example of a system 700 that supports symmetry verifications for differential signal vias of an electronic circuit design. The system 700 may include a processing resource 710, which may take the form of a single or multiple processors. The processor(s) may include a central processing unit (CPU), microprocessor, or any hardware device suitable for executing instructions stored on a machine-readable medium, such as the machine-readable medium 720 shown in FIG. 7. The machine-readable medium 720 may be any non-transitory electronic, magnetic, optical, or other physical storage device that stores executable instructions, such as the instructions 722, 724, 726, 728, 730, and 732 shown in FIG. 7. As such, the machine-readable medium 720 may be, for example, Random Access Memory (RAM) such as dynamic RAM (DRAM), flash memory, memristor memory, spin-transfer torque memory, an Electrically-Erasable Programmable Read-Only Memory (EEPROM), a storage drive, an optical disk, and the like.

The system 700 may execute instructions stored on the machine-readable medium 720 through the processing resource 710. Executing the instructions may cause the system 700 to perform any of the features described herein, including according to any features of the input engine 108, the symmetry verification engine 110, or a combination thereof.

For example, execution of the instructions 722, 724, 726, 728, 730 and 732 by the processing resource 710 may cause the system 700 to access an electronic circuit design of an electronic design automation (EDA) tool (instructions 722); access an input list of net names for symmetric verification (instructions 724); and for each particular net specified in the input list of net names: identify a pair of differential signal vias in the electronic circuit design corresponding to the particular net (instructions 726); determine a verification area surrounding the pair of differential signal vias (instructions 728); realign the verification area to a local coordinate system for the verification area such that and a midpoint between the pair of signal vias is a center of the local coordinate system and the pair of differential signal vias are positioned along a horizontal axis of the local coordinate system (instructions 730); and verify that any ground via within the verification area satisfies symmetry criteria with respect to the pair of differential signal vias based on a position of the particular ground via in the local coordinate system, a position of a different ground via in the local coordinate system, or a combination of both (instructions 732).

In some examples, instructions stored on the machine-readable medium 720 may be executable to verify a particular ground via within the verification area satisfies the symmetry criteria when the particular ground via is positioned on a vertical axis of the local coordinate system that intersects the horizontal axis at the midpoint between the pair of differential signal vias. The instructions may be executable to verify the particular ground via satisfies the symmetry criteria further when the different ground via has a horizontal coordinate value that is the inverse of a horizontal coordinate value of the particular ground via and the different ground via has a vertical coordinate value that is the inverse of a vertical coordinate value of the particular ground via. The instructions may be executable to verify the particular ground via satisfies the symmetry criteria yet further when the different ground via has a horizontal coordinate value that is the inverse of a horizontal coordinate value of the particular ground via; and the different ground via has a vertical coordinate value that is equal to a vertical coordinate value of the particular ground via.

In some examples, instructions stored on the machine-readable medium 720 may be executable to access a tolerance threshold and verify a particular ground via within the verification area satisfies the symmetry criteria when a distance between the particular ground and a vertical axis of the local coordinate system that intersects the horizontal axis at the midpoint between the pair of differential signal vias is within the tolerance threshold. The instructions may be executable to verify the particular ground via satisfies the symmetry criteria further when the different ground via has a horizontal coordinate value that is within the tolerance threshold from the inverse of a horizontal coordinate value of the particular ground via and the different ground via has a vertical coordinate value that is within the tolerance threshold from the inverse of a vertical coordinate value of the particular ground via. The instructions may be executable to verify the particular ground via satisfies the symmetry criteria yet further when the different ground via has a horizontal coordinate value that is within the tolerance threshold from the inverse of a horizontal coordinate value of the particular ground via and the different ground via has a vertical coordinate value that is within the tolerance threshold from a vertical coordinate value of the particular ground via.

The systems, methods, devices, engines, and logic described above, including the input engine 108 and the symmetry verification engine 110, may be implemented in many different ways in many different combinations of hardware, logic, circuitry, and executable instructions stored on a machine-readable medium. For example, the input engine 108, the symmetry verification engine 110, or both, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the input engine 108, symmetry verification engine 110, or both.

The processing capability of the systems, devices, and engines described herein, including the input engine 108 and the symmetry verification engine 110, may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A system comprising:
an input engine to:
access an electronic circuit design of an electronic design automation (EDA) tool; and
identify a particular net in the electronic circuit design; and
a symmetry verification engine to:
identify a pair of differential signal vias in the electronic circuit design corresponding to the particular net;
determine a verification area surrounding the pair of differential signal vias; and
verify that a particular ground via within the verification area satisfies symmetry criteria with respect to the pair of differential signal vias, wherein the symmetry verification engine is further to realign the verification area to a local coordinate system for the verification area such that the pair of differential signal vias are positioned along a horizontal axis of the local coordinate system and a midpoint between the pair of signal vias is a center of the local coordinate system,
wherein the symmetry verification engine is to verify that the particular ground via satisfies the symmetry criteria based on a position of the particular ground via in the local coordinate system, a position of a different ground via in the local coordinate system, or a combination of both, wherein the input engine is further to access a tolerance threshold, wherein the symmetry verification engine is to account for the tolerance threshold in verifying that the particular ground via satisfies the symmetry criteria and wherein the symmetry verification engine is to verify the symmetry criteria are satisfied when:
the different ground via has a horizontal coordinate value that is within the tolerance threshold from the inverse of a horizontal coordinate value of the particular ground via; and
the different ground via has a vertical coordinate value that is within the tolerance threshold form the inverse of a vertical coordinate value of the particular ground via,
wherein the electronic circuit design is provided for manufacturing electronic devices.

2. The system of claim 1, wherein the input engine is further to access a verification radial parameter; and
wherein the symmetry verification engine is to determine the verification area as a circular area with a center point equal to a midpoint between the pair of differential signal vias and a radius equal to the verification radial parameter.

3. The system of claim 1, wherein the symmetry verification engine is further to determine the particular ground via is positioned within the verification area when a center of the particular ground via is within the verification area.

4. The system of claim 1, wherein the symmetry verification engine is to verify the symmetry criteria are satisfied when:
the different ground via has a horizontal coordinate value that is within the tolerance threshold from the inverse of a horizontal coordinate value of the particular ground via; and
the different ground via has a vertical coordinate value that is within the tolerance threshold from a vertical coordinate value of the particular ground via.

5. A system comprising:
an input engine to:
access an electronic circuit design of an electronic design automation (EDA) tool; and
identify a particular net in the electronic circuit design; and
a symmetry verification engine to:
identify a pair of differential signal vias in the electronic circuit design corresponding to the particular net determine a verification area surrounding the pair of differential signal vias; and
verify that a particular ground via within the verification area satisfies symmetry criteria with respect to the pair of differential signal vias, wherein the symmetry verification engine is further to realign the verification area to a local coordinate system for the verification area such that the pair of differential signal vias are positioned along a horizontal axis of the local coordinate system and a midpoint between the pair of signal vias is a center of the local coordinate system,
wherein the symmetry verification engine is to verify that the particular ground via satisfies the symmetry criteria based on a position of the particular ground via in the local coordinate system, a position of a different ground via in the local coordinate system, or a combination of both, wherein the symmetry verification engine is to verify the symmetry criteria are satisfied when:
the different ground via has a horizontal coordinate value that is the inverse of a horizontal coordinate value of the particular ground via; and
the different ground via has a vertical coordinate value that is equal to a vertical coordinate value of the particular ground via, wherein the electronic circuit design is provided for manufacturing electronic devices.

6. The system of claim 5, wherein the symmetry verification engine is to verify the symmetry criteria are satisfied when:
the different ground via has a horizontal coordinate value that is the inverse of a horizontal coordinate value of the particular ground via; and
the different ground via has a vertical coordinate value that is the inverse of a vertical coordinate value of the particular ground via.

7. A method comprising:
accessing an electronic circuit design of an electronic design automation (EDA) tool;
accessing symmetry verification parameters including an input list of net names for symmetry verification and a verification radial parameter; and
for each particular net specified in the list of net names:
identifying a pair of differential signal vias in the electronic circuit design corresponding to the particular net;
determining a verification area surrounding the pair of differential signal vias;
realigning the verification area to a local coordinate system for the verification area such that and a midpoint between the pair of signal vias is a center of the local coordinate system and the pair of differential signal vias are positioned along a horizontal axis of the local coordinate system; and
verifying that any ground via within the verification area satisfies symmetry criteria with respect to the pair of differential signal vias based on a position of the particular ground via in the local coordinate system, a position of a different ground via in the local coordinate system, or a combination of both, wherein the particular ground via within the verification area satisfies the symmetry criteria when:
a distance between the particular ground via and a vertical axis of the local coordinate system that intersects the horizontal axis at the midpoint between the pair of differential signal vias is within a tolerance threshold; and
wherein the particular ground via satisfies the symmetry criteria further when:
the different ground via has a horizontal coordinate value that is within the tolerance threshold from the inverse of a horizontal coordinate value of the particular ground via; and
the different ground via has a vertical coordinate value that is within the tolerance threshold from the inverse of a vertical coordinate value of the particular ground via,
wherein the particular ground via satisfies the symmetry criteria further when:
the different ground via has a horizontal coordinate value that is within the tolerance threshold from the inverse of a horizontal coordinate value of the particular ground via; and
the different ground via has a vertical coordinate value that is within the tolerance threshold from a vertical coordinate value of the particular ground via, and
wherein the electronic circuit design is provided for manufacturing electronic devices.

8. The method of claim 7, wherein verifying that the particular ground via satisfies the symmetry criteria further comprises:
identifying a ground linking segment that passes through the particular ground via and a different ground via in the verification area; and
determining the particular ground via satisfies the symmetry criteria when:
the ground linking segment intersects the first axis within the tolerance threshold from a midpoint between the pair of differential signal vias;
the ground linking segment is perpendicular to the second axis; and
a midpoint of the ground linking segment is within the tolerance threshold from the midpoint between the pair of differential signals.

9. The method of claim 8, further comprising identifying the tolerance threshold as a user-specified tolerance threshold value.

10. The method of claim 7, further comprising:
identifying a particular ground via in the electronic circuit design is within the verification area of a pair of differential signal vias when a center of the particular ground via is located within the verification area.

11. The method of claim 7, further comprising:
identifying a particular ground via in the electronic circuit design is not within the verification area of a pair of differential signal vias when a center of the particular ground via is not located within the verification area.

12. A non-transitory machine-readable medium comprising instructions executable by at least one processor to:
access an electronic circuit design of an electronic design automation (EDA) tool;
access an input list of net names for symmetric verification; and
for each particular net specified in the input list of net names:
identify a pair of differential signal vias in the electronic circuit design corresponding to the particular net;
determine a verification area surrounding the pair of differential signal vias;
realign the verification area to a local coordinate system for the verification area such that and a midpoint between the pair of signal vias is a center of the local coordinate system and the pair of differential signal vias are positioned along a horizontal axis of the local coordinate system; and
verify that any ground via within the verification area satisfies symmetry criteria with respect to the pair of differential signal vias based on a position of the particular ground via in the local coordinate system, a position of a different ground via in the local coordinate system, or a combination of both, wherein the instructions are executable to verify a particular ground via within the verification area satisfies the symmetry criteria when:
the particular ground via is positioned on a vertical axis of the local coordinate system that intersects the horizontal axis at the midpoint between the pair of differential signal vias;
wherein the instructions are executable to verify the particular ground via satisfies the symmetry criteria further when:
the different ground via has a horizontal coordinate value that is the inverse of a horizontal coordinate value of the particular ground via; and
the different ground via has a vertical coordinate value that is the inverse of a vertical coordinate value of the particular ground via; and wherein the instructions are executable to verify the particular ground via satisfies the symmetry criteria further when:
the different ground via has a horizontal coordinate value that is the inverse of a horizontal coordinate value of the particular ground via; and
the different ground via has a vertical coordinate value that is equal to a vertical coordinate value of the particular ground via,
wherein the electronic circuit design is provided for manufacturing electronic devices.

13. A non-transitory machine-readable medium comprising instructions executable by at least one processor to:
access an electronic circuit design of an electronic design automation (EDA) tool;
access an input list of net names for symmetric verification; and
for each particular net specified in the input list of net names:
identify a pair of differential signal vias in the electronic circuit design corresponding to the particular net;
determine a verification area surrounding the pair of differential signal vias;
realign the verification area to a local coordinate system for the verification area such that and a midpoint between the pair of signal vias is a center of the local coordinate system and the pair of differential signal vias are positioned along a horizontal axis of the local coordinate system; and
verify that any ground via within the verification area satisfies symmetry criteria with respect to the pair of differential signal vias based on a position of the particular ground via in the local coordinate system, a position of a different ground via in the local coordinate system, or a combination of both, wherein the instructions are further executable to access a tolerance threshold; and
wherein the instructions are executable to verify a particular ground via within the verification area satisfies the symmetry criteria when:
a distance between the particular ground via and a vertical axis of the local coordinate system that intersects the horizontal axis at the midpoint between the pair of differential signal vias is within the tolerance threshold;
wherein the instructions are executable to verify the particular ground via satisfies the symmetry criteria further when:
the different ground via has a horizontal coordinate value that is within the tolerance threshold from the inverse of a horizontal coordinate value of the particular ground via; and
the different ground via has a vertical coordinate value that is within the tolerance threshold from the inverse of a vertical coordinate value of the particular ground via; and
wherein the instructions are executable to verify the particular ground via satisfies the symmetry criteria further when:
the different ground via has a horizontal coordinate value that is within the tolerance threshold from the inverse of a horizontal coordinate value of the particular ground via; and
the different ground via has a vertical coordinate value that is within the tolerance threshold from a vertical coordinate value of the particular ground via,
wherein the electronic circuit design is provided for manufacturing electronic devices.

* * * * *